(12) United States Patent
Johnson et al.

(10) Patent No.: US 12,433,166 B2
(45) Date of Patent: Sep. 30, 2025

(54) CERAMIC STACK ASSEMBLY FIXTURE

(71) Applicant: The United States of America, as Represented by the Secretary of the Navy, Crane, IN (US)

(72) Inventors: Matthew Johnson, Springville, IN (US); William Riggins, Bloomington, IN (US); Scott L. Small, Newberry, IN (US)

(*) Notice: Subject to any disclaimer, the term of this patent is extended or adjusted under 35 U.S.C. 154(b) by 136 days.

(21) Appl. No.: 18/394,433

(22) Filed: Dec. 22, 2023

(65) Prior Publication Data

US 2024/0251681 A1 Jul. 25, 2024

Related U.S. Application Data

(60) Provisional application No. 63/440,553, filed on Jan. 23, 2023.

(51) Int. Cl.
| | |
|---|---|
| *H10N 30/057* | (2023.01) |
| *B06B 1/06* | (2006.01) |
| *B32B 37/00* | (2006.01) |
| *B32B 37/10* | (2006.01) |

(52) U.S. Cl.
CPC ......... *H10N 30/057* (2023.02); *B06B 1/0611* (2013.01); *B32B 37/0046* (2013.01); *B32B 37/10* (2013.01); B06B 2201/74 (2013.01); B32B 2311/12 (2013.01); B32B 2315/02 (2013.01); B32B 2457/00 (2013.01)

(58) Field of Classification Search
CPC .. H10N 30/057; B32B 37/10; B32B 37/0046; B06B 1/0611; B06B 2201/74; Y10T 29/42

See application file for complete search history.

(56) References Cited

U.S. PATENT DOCUMENTS 4,582,240 A * 4/1986 Lux ...................... H10N 30/057 228/262.21

* cited by examiner

*Primary Examiner* — Carson Gross
(74) *Attorney, Agent, or Firm* — Naval Surface Warfare Center, Crane Division; Christopher Feigenbutz (57) ABSTRACT

Provided is a fixture for concentrically aligning and assembling a Ceramic Stack Assembly transducer during manufacturing. The CSA fixture comprises a base, a top compression cap, a central rod and a fastener, one or more alignment posts, and a driving wedge. The base further includes a groove to accept and align a transducer rear-centering ring at a central axis of the fixture. The transducer rear-centering ring supports one or more copper foil or ceramic rings during assembly. The alignment posts and driving wedge apply radial pressure to the copper foil or ceramic rings during assembly to force concentric alignment. The top compression cap, central rod, and fastener compress and stress the CSA Ceramic once assembled. The fixture simultaneously provides concentric alignment, foil alignment and provides a mechanism for stressing the CSA. A method of use is also provided.

3 Claims, 7 Drawing Sheets

CERAMIC STACK ASSEMBLY FIXTURE

CROSS-REFERENCE TO RELATED APPLICATIONS

The present application claims priority to U.S. Provisional Patent Application Ser. No. 63/440,553, filed Jan. 23, 2023, entitled "CERAMIC STACK ASSEMBLY FIXTURE," the disclosure of which is expressly incorporated by reference herein.

STATEMENT REGARDING FEDERALLY SPONSORED RESEARCH OR DEVELOPMENT

The invention described herein was made in the performance of official duties by employees of the Department of the Navy and may be manufactured, used and licensed by or for the United States Government for any governmental purpose without payment of any royalties thereon. This invention (Navy Case 200622US02) is assigned to the United States Government and is available for licensing for commercial purposes. Licensing and technical inquiries may be directed to the Technology Transfer Office, Naval Surface Warfare Center Crane, email: Crane_T2@navy.mil.

FIELD OF THE INVENTION

The field of invention relates generally to sonar transducers. More particularly, it pertains to a fixture for aligning a Ceramic Stack Assembly transducer during manufacturing.

BACKGROUND

The AN/SQQ-89(V) acoustic sonar weapons system is an integrated surface ship undersea warfare (USW) combat system with the capability to search, detect, classify, localize, and attack submarine targets. The AN/SQS-53 hull mounted sonar array is a large bulb-like structure built into the bows below the water line of U.S. Navy Arleigh Burke-class destroyers and Ticonderoga-class cruisers. Part of the system includes the TR-343 sonar transducer Ceramic Stack Assembly (CSA), which provides the required piezoelectric characteristics to produce mechanical motion in the water for generating sonar signals when a large voltage is applied. The CSA is what provides electrical feedback to the system and essentially acts as the systems engine. During active mode operation, the CSA is charged with high voltage at the ceramic's resonant frequency. This causes the CSA to rapidly expand and contract, which in turn resonates the Boot Assembly (BA). During passive mode operation, the vibrations in the water cause the CSA to expand and contract, creating electrical current that travels back to the signal processor and to a display console. These units must also be able to withstand an explosive shock and remain operational.

Concentric alignment is a key inspection/performance parameter for all CSA's. If the CSA is not concentrically aligned, it will weaken the structural integrity and cause failures during shock and could affect the electrical output. As is clear from the above, a fixture that can simultaneously provide concentric alignment, foil alignment and provides a mechanism for stressing the CSA is needed.

SUMMARY OF THE INVENTION

Disclosed is a fixture for concentrically aligning and assembling a Ceramic Stack Assembly transducer during manufacturing. The CSA fixture comprises a base, a top compression cap, a central rod and a fastener, one or more alignment posts, and a driving wedge. The base further includes a groove to accept and align a transducer rear-centering ring at a central axis of the fixture. The transducer rear-centering ring supports one or more copper foil or ceramic rings during assembly. The alignment posts and driving wedge apply radial pressure to the copper foil or ceramic rings during assembly to force concentric alignment. The top compression cap, central rod, and fastener compress and stress the CSA Ceramic once assembled. The fixture simultaneously provides concentric alignment, foil alignment and provides a mechanism for stressing the CSA. A method of assembly is also provided.

Additional features and advantages of the present invention will become apparent to those skilled in the art upon consideration of the following detailed description of the illustrative embodiment exemplifying the best mode of carrying out the invention as presently perceived.

BRIEF DESCRIPTION OF THE DRAWINGS

The detailed description of the drawings particularly refers to the accompanying figures in which.

DETAILED DESCRIPTION OF THE DRAWINGS

The embodiments of the invention described herein are not intended to be exhaustive or to limit the invention to precise forms disclosed. Rather, the embodiments selected for description have been chosen to enable one skilled in the art to practice the invention.

Generally, provided is a fixture for concentrically aligning and assembling a Ceramic Stack Assembly transducer comprising: a base; a top compression cap, a central rod and a fastener; one or more alignment posts, and a driving wedge; the base further comprises a groove to accept and align a transducer rear-centering ring at a central axis of the fixture; wherein the transducer rear-centering ring supports one or more copper foil or ceramic rings during assembly; wherein the one or more alignment posts and the driving wedge apply radial pressure to the one or more copper foil or ceramic rings during assembly to force concentric alignment thereof; wherein the top compression cap, the central rod, and the fastener compress and stress the Ceramic Stack Assembly once assembled.

In an illustrative embodiment, provided is a fixture for concentrically aligning and assembling a Ceramic Stack Assembly transducer comprising: one or more copper foil rings; one or more ceramic rings; an adhesive; a base; a top compression cap, a central rod and a fastener; one or more alignment posts and a driving wedge; the base further comprises a groove to accept and align a transducer rear-centering ring at a central axis of the fixture; wherein the transducer rear-centering ring supports the one or more copper foil or ceramic rings during assembly; wherein the adhesive is placed between the one or more copper foil or ceramic rings during assembly; wherein the one or more alignment posts and the driving wedge apply radial pressure to the one or more copper foil or ceramic rings during assembly to force concentric alignment thereof; wherein the top compression cap, the central rod, and the fastener compress and stress the Ceramic Stack Assembly once assembled to allow the adhesive to set.

In an illustrative embodiment, provided is a method of assembling concentrically aligning and assembling a Ceramic Stack Assembly transducer comprising: providing a Ceramic Stack Assembly transducer comprising a base; a top compression cap, a central rod and a fastener; one or more alignment posts and a driving wedge; the base further comprises a groove to accept and align a transducer rear-centering ring at a central axis of the fixture; positioning the rear-centering ring on the base; positioning a copper foil ring on the rear-centering ring and applying an adhesive to the copper foil ring; placing additional the copper foil rings or a ceramic ring on the adhesive; positioning the one or more alignment posts and the driving wedge onto the base to concentrically orient the copper foil ring or a ceramic ring, wherein the driving wedge applies pressure to the alignment posts to force concentric alignment of the copper foil or the ceramic rings; continuing to apply the adhesive and add the copper foil or ceramic rings until a desired number is achieved; placing the top compression cap on top of the copper foil and ceramic rings, installing the fastener on the central rod, and compressing and stressing the copper foil and ceramic rings against the base for a desired amount of time to allow the adhesive to set. wherein the transducer rear-centering ring supports one or more copper foil or ceramic rings during assembly; wherein the one or more alignment posts and the driving wedge apply radial pressure to the one or more copper foil or ceramic rings during assembly to force concentric alignment thereof; wherein the top compression cap, the central rod, and the fastener compress and stress the Ceramic Stack Assembly once assembled.

Figure 1:
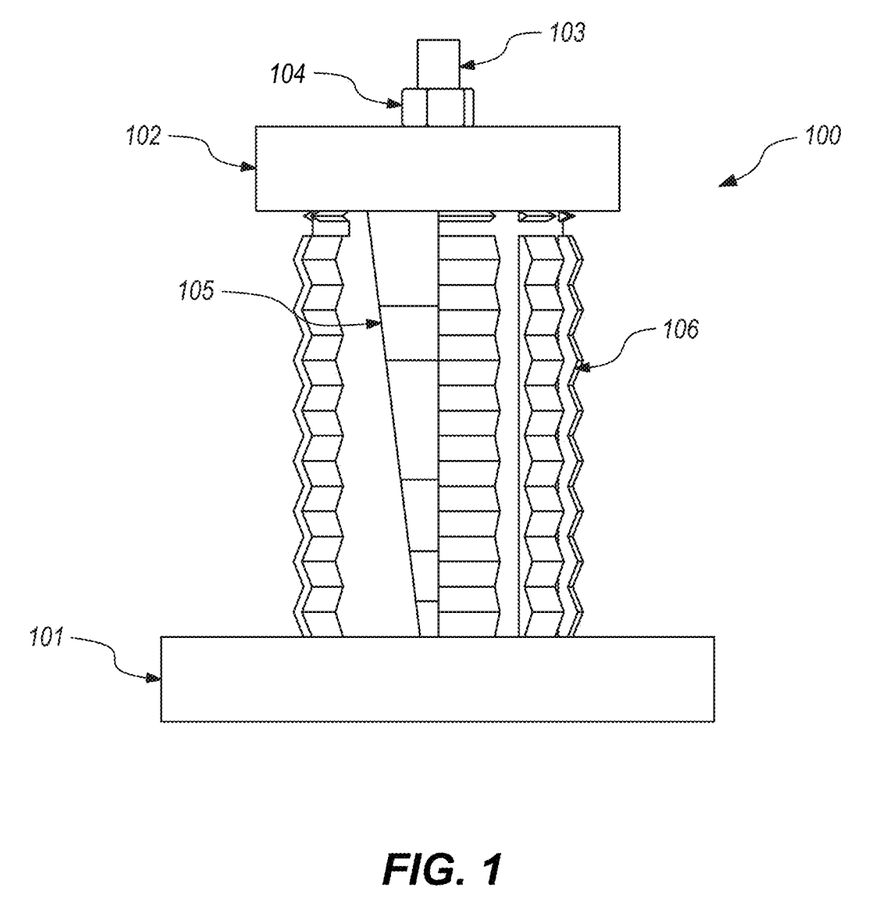
FIG. 1 shows a view of a ceramic stack assembly fixture.
Figure 2:
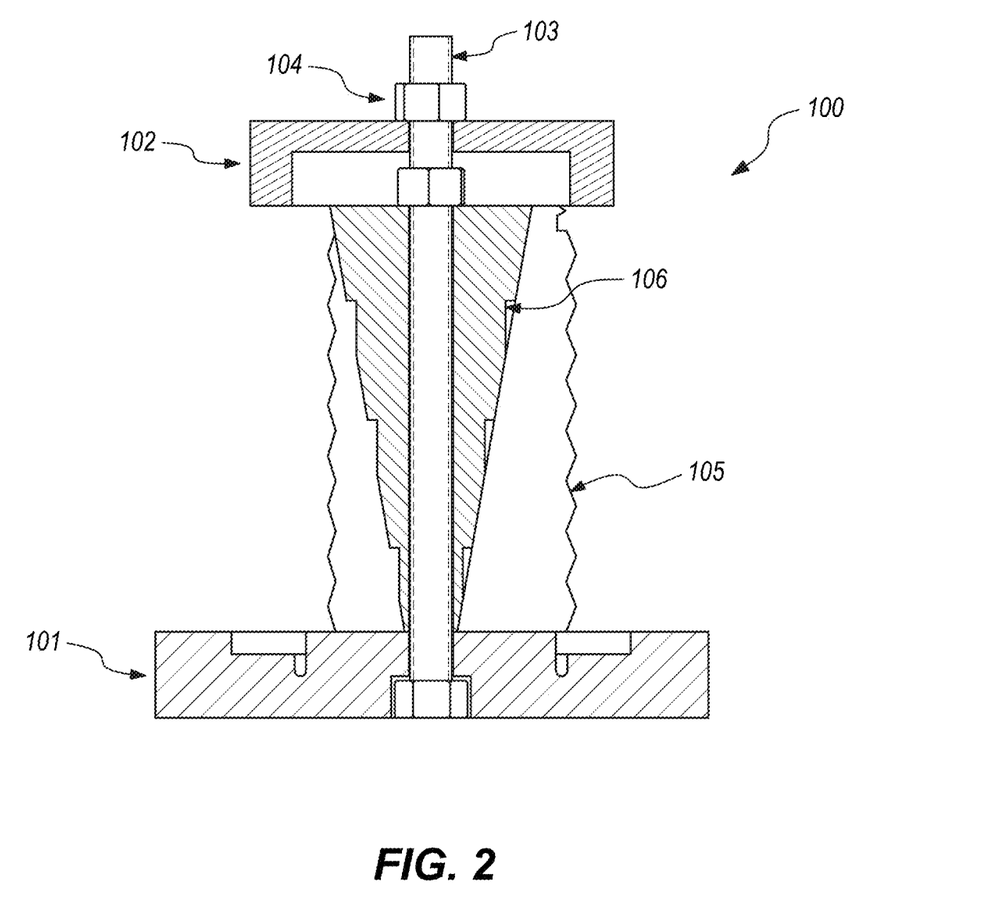
FIG. 2 shows a cross-sectional view of a ceramic stack assembly fixture.
Figure 3:
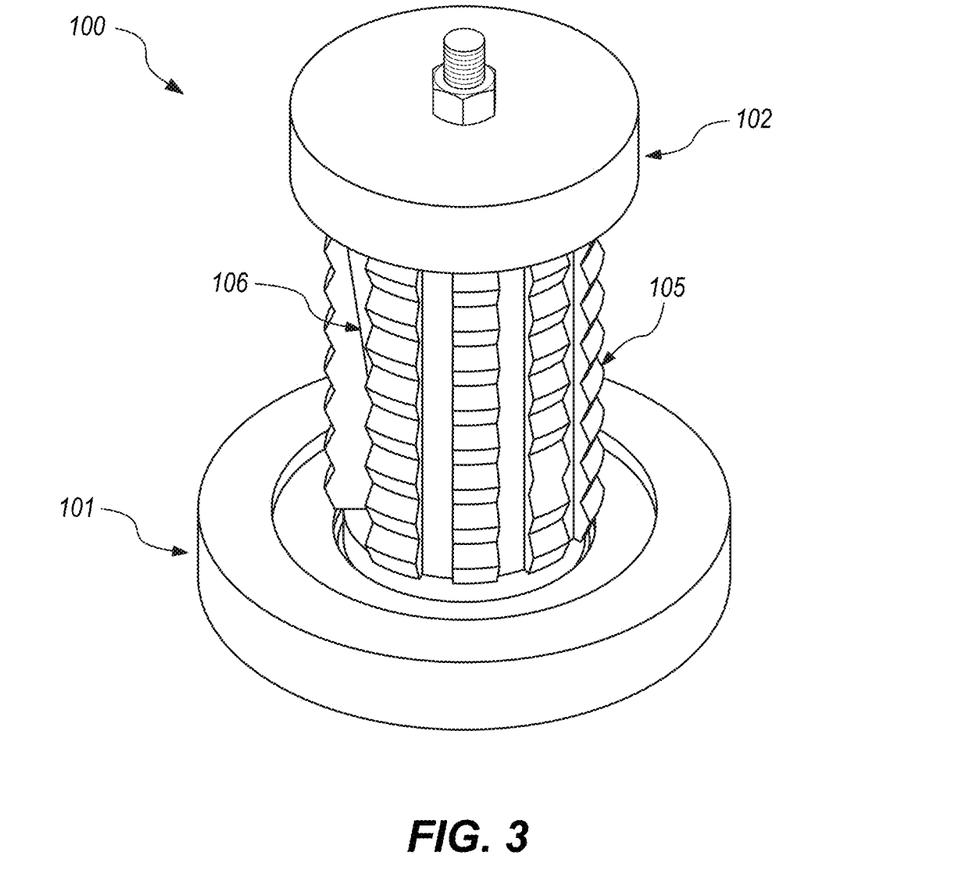
FIG. 3 shows a perspective view of a ceramic stack assembly fixture.
Figure 4:
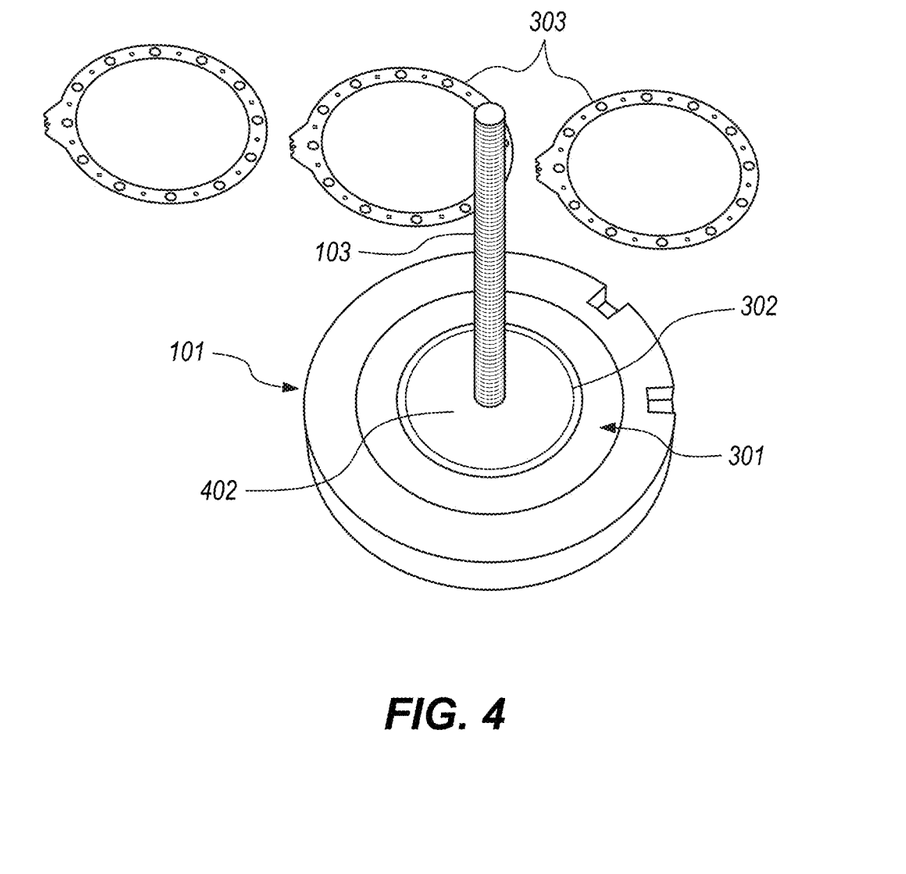
FIG. 4 shows a view of a rear centering ring positioned in a groove of a base and multiple copper foil rings prior to installation.

FIG. 1 shows a view of a ceramic stack assembly fixture 100, FIG. 2 shows a cross-sectional view of a ceramic stack assembly fixture 100, and FIG. 3 shows a perspective view of a ceramic stack assembly fixture 100. In an illustrative embodiment, the device comprises a base 101, a top compression cap 102 with a central rod 103, a fastener 104, one or more alignment posts 105, and a driving wedge 106. The base 101 provides support for the fixture to ensure proper assemble of the CSA. In an illustrative embodiment, as shown in FIG. 4, the base 101 further comprises a groove 302 to accept and align a transducer rear-centering ring 301 at a central axis 402 of the fixture. In an illustrative embodiment, the CSA is assembled on the base 101 and rear-centering ring 301, and comprises a series of copper/ceramic and ceramic/ceramic rings stacked between the base 101 and top compression cap 102. The one or more alignment posts 105 orient the rings during assembly, while the driving wedge 106 applies pressure to the alignment posts 105, which in turn applies radial pressure to the ceramic rings to force concentric alignment and to ensure the correct tolerances are achieved.

FIG. 4 shows a view of a rear centering ring 301 positioned in a groove 302 of a base 101 and multiple copper foil rings 303 prior to installation. The base 101 is used to align the rear-centering ring 301 in relation to a central axis 402 of the base 101. The rear-centering ring 301 sits in a grove 302 formed in the base 101. The rear-centering ring 301 also serves to position the copper foil rings 303 and the ceramic rings (not shown) in the correct orientation on the base 101. The central rod 103 serves as the structural backbone of the fixture and keeps the fixture in line with the central axis 402. The central rod 103 and fastener also provide a mechanism for compressing/stressing the CSA once assembled.

Figure 5:
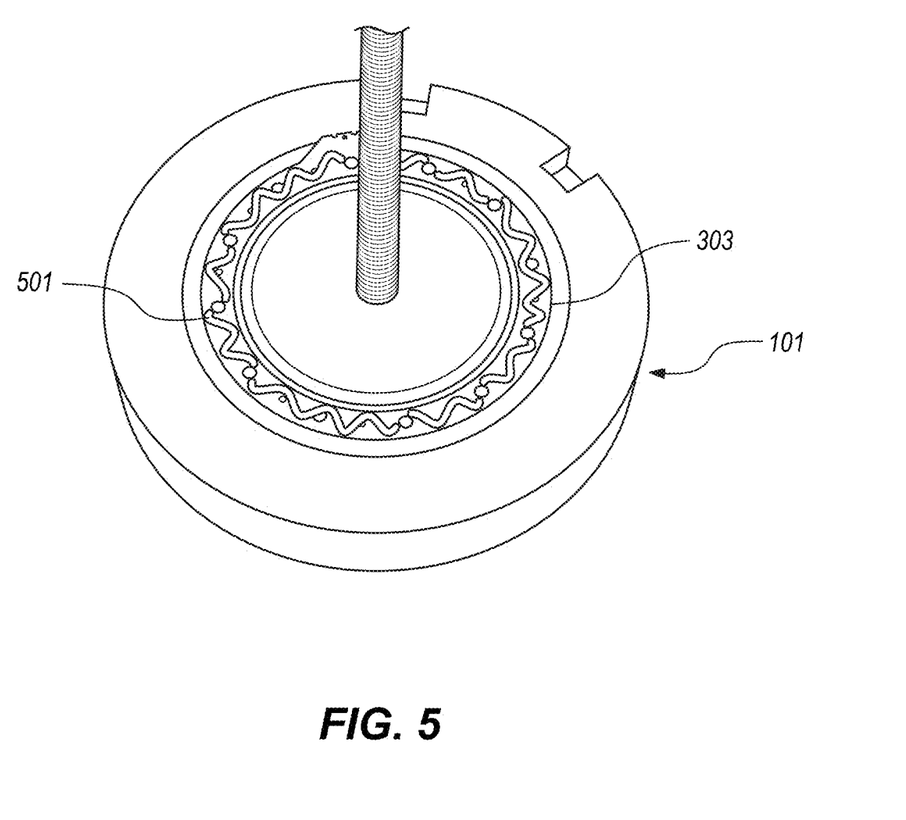
FIG. 5 shows a view of a copper foil with adhesive applied thereto.
Figure 6:
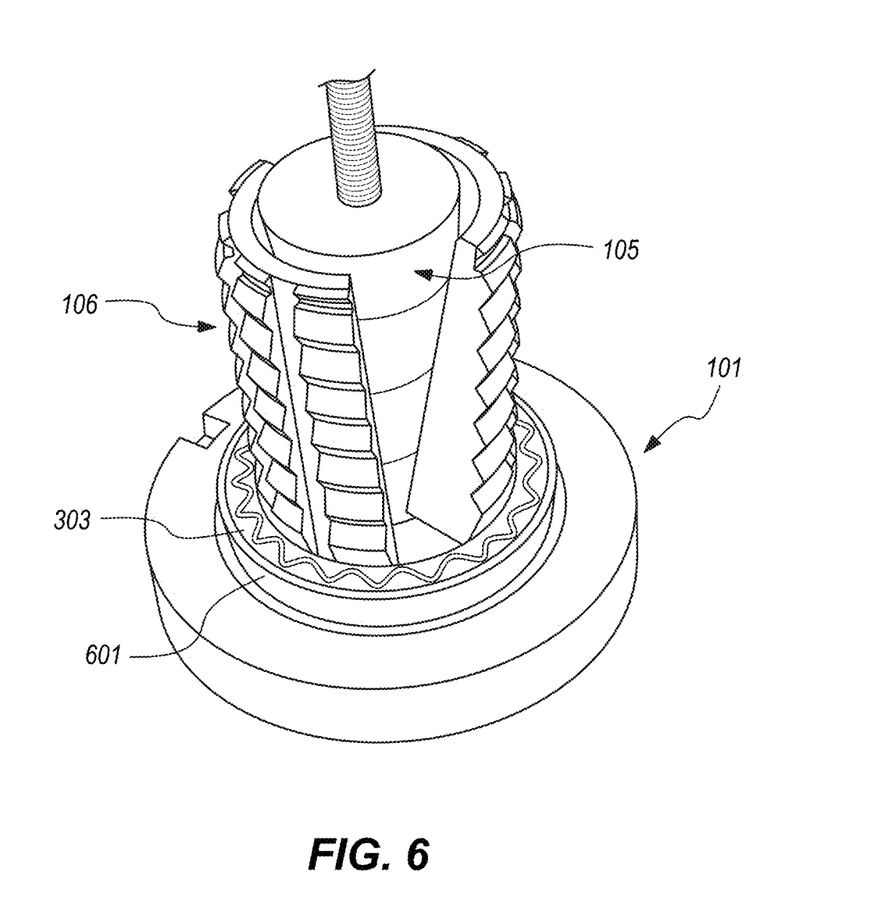
FIG. 6 shows a view of copper foils and ceramic foils being assembled on a front centering ring.

FIG. 5 shows a view of a copper foil 303 with adhesive 501 applied thereto, and FIG. 6 shows a view of copper foils 303 and ceramic foils 601 being assembled on a front centering ring 301. To begin assembly of the CSA, the rear-centering ring 301 is positioned on the base 101 and a copper foil ring 303 is placed on the rear-centering ring 301. An adhesive 501 is applied to the copper foil ring 303 and an additional copper foil ring 303 or ceramic ring 601 is placed on the adhesive 501. The one or more alignment posts 105 are then positioned on the base 101 to orient the rings during assembly, while the driving wedge 106 is installed to apply pressure to the alignment posts 105. The process of applying adhesive 501 and adding copper foil rings 303 or ceramic rings 601 rings is continued until the desired number of rings for the CSA are achieved. In an illustrative embodiment, the CSA can be assembled with any desired configuration of copper/ceramic and ceramic/ceramic rings. As can be appreciated, the one or more alignment posts 105 in conjunction with the driving wedge 106 force concentric alignment of the copper foil rings 303 and ceramic rings 601 and the front centering ring 301. The driving wedge 106 is inserted to apply pressure to the alignment posts 105, and the alignment posts 105 in turn apply radial pressure to the rings.

Figure 7:
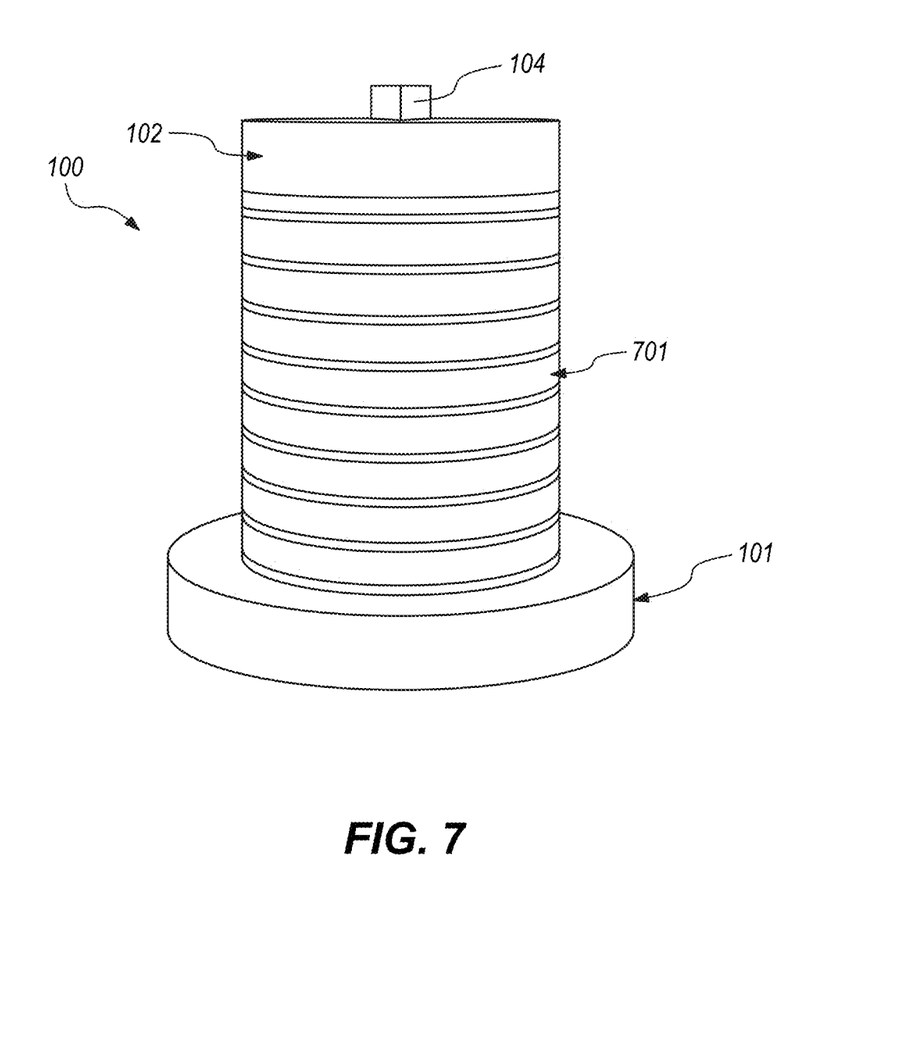
FIG. 7 shows a view of an assembled ceramic stack assembly assembled on a fixture.

FIG. 7 shows a view of an assembled ceramic stack assembly 701 assembled on a fixture. Once assembly of the CSA 701 is complete, the top compression cap 102 is placed on top of the CSA 701. The top compression cap 102, central rod, and fastener 104 compress and stress the CSA 701 against the base 101 for a desired amount of time to allow the adhesive to set. The completed CSA 701 can be removed from the fixture 100 and the process can be repeated as desired.

In an illustrative embodiment, a method of assembling a CSA is also provided. The method comprises the steps of: providing a Ceramic Stack Assembly transducer comprising a base; a top compression cap, a central rod and a fastener; one or more alignment posts and a driving wedge. In an illustrative embodiment, the base further comprises a groove to accept and align a transducer rear-centering ring at a central axis of the fixture. In an illustrative embodiment, the method further comprises positioning the rear-centering ring on the base; positioning a copper foil ring on the rear-centering ring and applying an adhesive to the copper foil ring; placing additional the copper foil rings or a ceramic ring on the adhesive; positioning the one or more alignment posts and the driving wedge onto the base to concentrically orient the copper foil ring or a ceramic ring. In an illustrative embodiment, the driving wedge applies pressure to the alignment posts to force concentric alignment of the copper foil or the ceramic rings. In an illustrative embodiment, the method further comprises continuing to apply the adhesive and add the copper foil or ceramic rings until a desired number is achieved; placing the top compression cap on top of the copper foil and ceramic rings, installing the fastener on the central rod, and compressing and stressing the copper foil and ceramic rings against the base for a desired amount of time to allow the adhesive to set.

The advantage of a concentricity alignment fixture is that it allows for a repeatable process that ensures that products meet form, fit, and function requirements. The fixture takes out the factor of human error and guesswork to ensure quality parts with high levels of repeatability. The fixture is designed to be used to align TR-343 ceramic rings. In an illustrative embodiment, the fixture can be used to align other cylindrical components by modifying the size of the individual parts.

Although the invention has been described in detail with reference to certain preferred embodiments, variations and modifications exist within the spirit and scope of the invention as described and defined in the following claims.

The invention claimed is:

1. A fixture for concentrically aligning and assembling a Ceramic Stack Assembly transducer comprising:
    a base;
    a top compression cap, a central rod and a fastener;
    one or more alignment posts and a driving wedge;
    said base further comprises a groove to accept and align a transducer rear-centering ring at a central axis of said fixture;
    wherein said transducer rear-centering ring supports one or more copper foil or ceramic rings during assembly;
    wherein said one or more alignment posts and said driving wedge apply radial pressure to said one or more copper foil or ceramic rings during assembly to force concentric alignment thereof;
    wherein said top compression cap, said central rod, and said fastener compress and stress said Ceramic Stack Assembly once assembled.

2. A fixture for concentrically aligning and assembling a Ceramic Stack Assembly transducer comprising:
    one or more copper foil rings;
    one or more ceramic rings;
    an adhesive;
    a base;
    a top compression cap, a central rod and a fastener;
    one or more alignment posts and a driving wedge;
    said base further comprises a groove to accept and align a transducer rear-centering ring at a central axis of said fixture;
    wherein said transducer rear-centering ring supports said one or more copper foil or ceramic rings during assembly;
    wherein said adhesive is placed between said one or more copper foil or ceramic rings during assembly;
    wherein said one or more alignment posts and said driving wedge apply radial pressure to said one or more copper foil or ceramic rings during assembly to force concentric alignment thereof;
    wherein said top compression cap, said central rod, and said fastener compress and stress said Ceramic Stack Assembly once assembled to allow said adhesive to set.

3. A method of assembling concentrically aligning and assembling a Ceramic Stack Assembly transducer comprising:
    providing a Ceramic Stack Assembly transducer comprising
    a base;
    a top compression cap, a central rod and a fastener;
    one or more alignment posts and a driving wedge;
    said base further comprises a groove to accept and align a transducer rear-centering ring at a central axis of said fixture;
    positioning said rear-centering ring on said base;
    positioning a copper foil ring on said rear-centering ring and applying an adhesive to said copper foil ring;
    placing additional said copper foil rings or a ceramic ring on said adhesive;
    positioning said one or more alignment posts and said driving wedge onto said base to concentrically orient said copper foil ring or a ceramic ring, wherein said driving wedge applies pressure to said alignment posts to force concentric alignment of said copper foil or said ceramic rings;
    continuing to apply said adhesive and add said copper foil or ceramic rings until a desired number is achieved;
    placing said top compression cap on top of said copper foil and ceramic rings, installing said fastener on said central rod, and compressing and stressing said copper foil and ceramic rings against said base for a desired amount of time to allow said adhesive to set.

* * * * *